(12) United States Patent
Perner et al.

(10) Patent No.: US 7,142,448 B2
(45) Date of Patent: Nov. 28, 2006

(54) METHOD AND SYSTEM FOR DATA COMMUNICATION ON A CHIP

(75) Inventors: Frederick A. Perner, Palo Alto, CA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/211,986

(22) Filed: Aug. 25, 2005

(65) Prior Publication Data

US 2005/0281078 A1    Dec. 22, 2005

Related U.S. Application Data

(62) Division of application No. 10/444,477, filed on May 23, 2003, now Pat. No. 6,956,762.

(51) Int. Cl.
*G11C 11/00* (2006.01)
*G11C 11/14* (2006.01)

(52) U.S. Cl. .................... 365/158; 365/171; 365/173

(58) Field of Classification Search ............... 365/158, 365/171, 173, 189.05
See application file for complete search history.

(56) References Cited

U.S. PATENT DOCUMENTS

| | | | |
|---|---|---|---|
| 6,147,922 A * | 11/2000 | Hurst et al. ............ | 365/225.5 |
| 6,363,000 B1 | 3/2002 | Perner et al. | |
| 6,532,168 B1 * | 3/2003 | Swanson et al. ........... | 365/158 |
| 6,836,429 B1 * | 12/2004 | Smith et al. ............... | 365/158 |

OTHER PUBLICATIONS

Matthew B. Leslie et al., "Noise-Shaping Sense Amplifier for MRAM Cross-point Arrays," IEEE Journal of Solid-State Circuits, vol. 41, No. 3, Mar. 2006, pp. 699-704.

* cited by examiner

*Primary Examiner*—Anh Phung

(57) ABSTRACT

Methods and apparatuses are disclosed for communicating data on a chip. In one embodiment, the method includes: reading the data value of a memory element utilizing conductors that are electrically coupled to the memory element, and communicating the value read from the memory element to other locations on chip using write conductors that are magnetically coupled to the memory element.

24 Claims, 5 Drawing Sheets

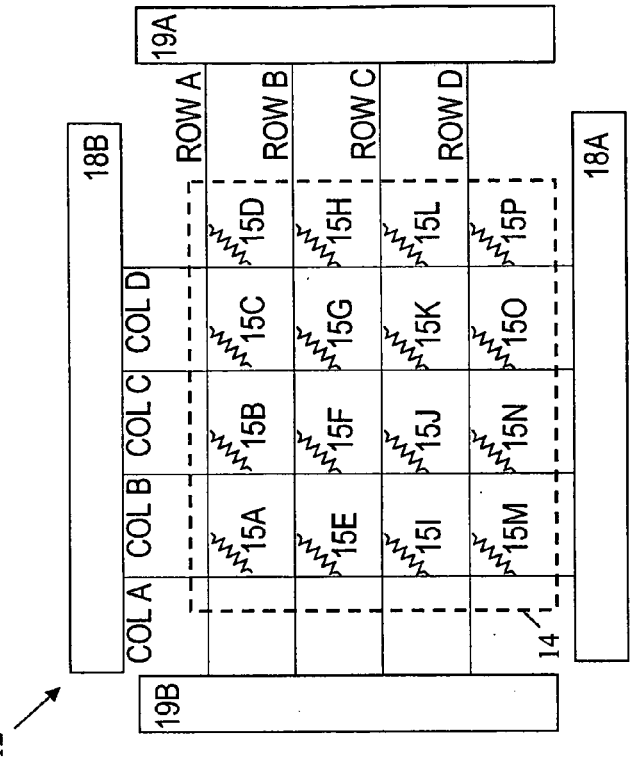
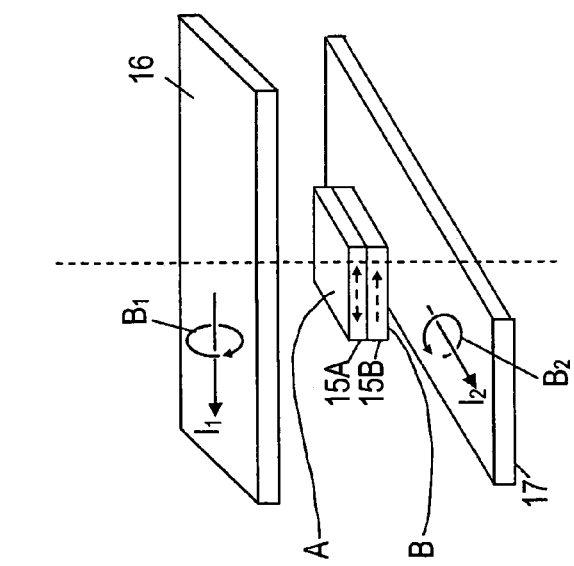

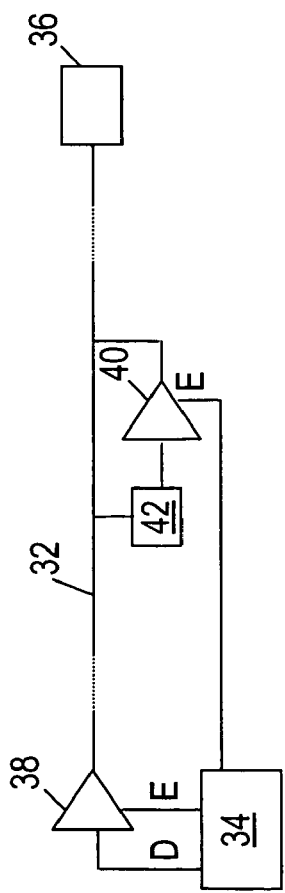
FIGURE 6
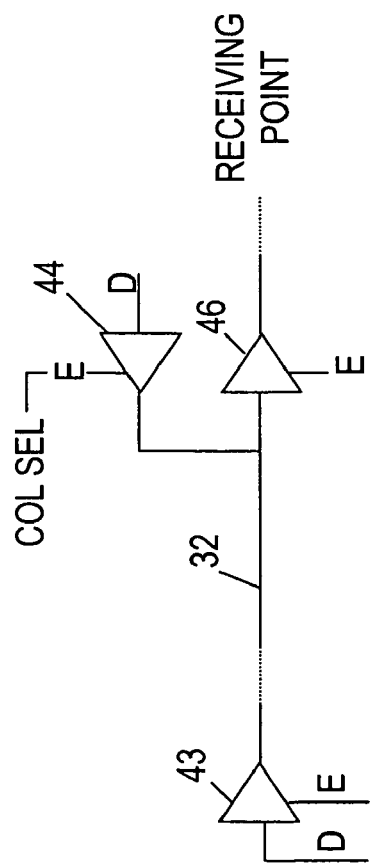
FIGURE 7
FIGURE 8

METHOD AND SYSTEM FOR DATA COMMUNICATION ON A CHIP

CROSS-REFERENCE TO RELATED APPLICATIONS

This is a divisional application of application Ser. No. 10/444,477, filed May 23, 2003, now U.S. Pat. No. 6,956,762, issued on Oct. 18, 2005, and is hereby incorporated by reference herein as if reproduced in full below.

BACKGROUND

Computers have become an integral part of society. Computers are complex and may include microprocessors, storage media (e.g., CD-ROM, hard drive, floppy drive), memory, and input/output devices. In general, the microprocessor executes instructions from various software programs that may be running on the computer. While running the programs, the microprocessor may need to read and write information to and from memory.

Recent trends in memory include solid state magnetic memory arrays. Magnetic memory arrays may have advantages over non-magnetic memory arrays (e.g., DRAM) because, among other things, they do not need to be refreshed. Magnetic memory arrays also offer the potential for very dense packing of memory elements.

As with most integrated circuitry, increasing densities may create routing problems. Typically an electrical path is necessary to move data from each memory element to an external pin. As the size and complexity of a memory increases, efficiently routing data may become a limiting factor.

BRIEF SUMMARY

Methods and apparatuses are disclosed for communicating data on a chip. In one embodiment, the method includes: reading the data value of a memory element utilizing conductors that are electrically coupled to the memory element and communicating the value read from the memory element to other locations on chip using write conductors that are magnetically coupled to the memory element.

BRIEF DESCRIPTION OF THE DRAWINGS

For a detailed description of the exemplary embodiments of the invention, reference will now be made to the accompanying drawings in which:

FIG. 1 shows a cross-section of an integrated circuit;

FIG. 2A shows a magnetic memory element;

FIG. 2B shows a three-dimensional representation of a magnetic memory element;

FIG. 3 shows a top down view of the integrated circuit of FIG. 1;

FIG. 6 shows a write conductor including exemplary circuitry;

FIG. 7 shows a buffer and an exemplary truth table associated with the buffer;

FIG. 8 shows a write conductor including another exemplary circuitry;

NOTATION AND NOMENCLATURE

Figure 5A:
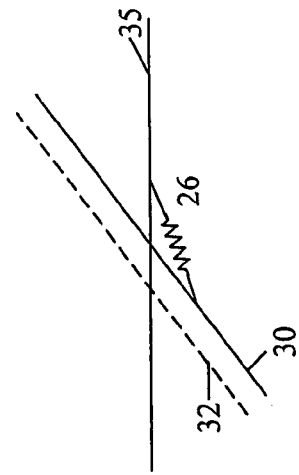
FIG. 5A shows a cross-section of a magnetic memory element.

Certain terms are used throughout the following description and claims to refer to particular system components. As one skilled in the art will appreciate, electronics companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . "

The term "couple" or "couples" is intended to mean either an indirect or direct electrical connection. Thus, if a first device couples to a second device, that connection may be through a direct electrical connection, or through an indirect electrical connection via other devices and connections. Also, the term "couple" or "couples" is also intended to refer to the situation in which a magnetic field emanating from a first material is induced in second material. For example, if a conductor carrying a current may emanate a magnetic field which may be coupled into a magnetic material.

The term "chip" is intended to refer to both packaged and unpackaged integrated circuits of any variety. For example, although memory chips are disclosed, one of skill will appreciate that other chips, such as microprocessors, often contain memory and therefore may employ the concepts disclosed herein.

DETAILED DESCRIPTION

The drawings and following discussion are directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

FIG. 1 depicts an integrated circuit cross-section including magnetic memory. A substrate 10 may comprise silicon, germanium, gallium arsenide, or other elements that have semiconducting properties. Circuitry 12 may be integrated onto substrate 10, and may include complementary metal oxide semiconductor ("CMOS") type transistors that may be processed according to various semiconductor processing techniques. Although circuitry 12 is discussed with respect to CMOS, other technologies (i.e., bipolar, JFET) may alternately be used. Circuitry 12 may implement circuitry for reading and writing digital information to and from magnetic memory 14. Because magnetic memory 14, and particularly the memory elements contained within magnetic memory 14, may be composed of materials that may not be used in constructing circuitry 12, circuitry 12 and memory 14 may be manufactured separately. For example in FIG. 1, the transistors in circuitry 12 may be integrated on the integrated circuit prior to integrating the memory elements of memory 14.

Magnetic memory 14 may include memory elements or bits, where information may be stored in the memory elements by altering their magnetic state. FIG. 2A shows a possible implementation of a memory element 15. Memory element 15 may include a layer 15A that has a magnetic field with fixed direction as shown. Memory element 15 may also include another layer 15B, which is integrated on top of layer 15A. The direction of the magnetic field of layer 15B may be adjusted to be parallel to the magnetic field of layer 15A (i.e., arrows in the same direction), or anti-parallel to the magnetic field of layer 15A (i.e., arrows in opposite directions). The electrical resistance of a layer between 15A and 15B may depend on the relative (parallel or anti-parallel) orientations of 15A and 15B.

FIG. 2B depicts a three-dimensional representation of memory element 15, with terminals A and B. In order to store data to memory element 15, orthogonal write lines 16 and 17 may be employed, where their crossing-point, as indicated by the dashed line in FIG. 2B, may be aligned with memory element 15. Circuitry 12 (not shown in FIG. 2B), may be coupled to write lines 16 and 17 to provide electrical currents $I_1$ and $I_2$. Current $I_1$ in write line 16 may generate a magnetic field $B_1$, and likewise current $I_2$ in write line 17 may generate a magnetic field $B_2$. Magnetic fields $B_1$ and $B_2$ may then collectively contribute to the magnetic field induced in memory element 15, where the magnetic fields $B_1$ and $B_2$ may be adjusted by adjusting the strength and direction of currents $I_1$ and $I_2$. For example, reversing the direction of the currents $I_1$ and $I_2$ will reverse the direction of the magnetic fields $B_1$ and $B_2$. Accordingly, the direction of the magnetic fields in layers 15A and 15B may be adjusted to be parallel or anti-parallel.

With the magnetic fields of 15A and 15B capable of being adjusted to be either parallel or anti-parallel, the resistance measured from terminal A to terminal B may be changed as the direction of the magnetic fields are changed. For example, if the magnetic fields are parallel the resistance may be 1 MΩ and associated with a digital 1, whereas if the magnetic fields are anti-parallel the resistance may be 1.1 MΩ and associated with a digital 0. Because the resistance of the memory element 15 may indicate the digital state, memory elements often are indicated using resistive elements.

FIG. 3 depicts a top down view of the integrated circuit cross-section of FIG. 1. Referring to FIG. 3, circuitry 12 may exist beneath the magnetic memory 14, which is shown as a dashed box, where individual memory elements 15A–P are depicted using resistive elements and may be arranged in an array of columns A–D and rows A–D. Column circuitry 18A–B and row circuitry 19A–B may be used to select a desired memory element from within the array of memory elements. Circuitry 18A and 18B may be substantially similar and may be identical. Likewise, circuitry 19A and 19B may be substantially similar and may be identical. Memory elements may be selected by decoding the desired row and column. For example, to select memory element 15H, column D may be decoded (selected) by circuitry 18A and also decoded by circuitry 18B, and row B may be decoded (selected) by circuitry 19A and also decoded by circuitry 19B.

With a desired memory element selected, data may be written to or read from the selected memory element. The complexity of circuitry 18A–B and 19A–B may increase as more memory elements are added to the array. As the complexity of circuitry 18A–B and 19A–B increases, the amount of chip area that they occupy may increase, thereby causing the cost of the chip to increase.

The storage capacity of magnetic memory 14 may depend on the number of individual memory elements memory 14 contains. For example, magnetic memory 14 may contain 64 rows by 256 columns of memory elements for a total of 16,384 memory elements or approximately 2 kilobytes ("KB") of storage space. Because a typical memory chip may have several megabytes of storage space—e.g., 16 MB to 64 MB—magnetic memory 14 may need to be replicated many times in order to achieve the desired amount of storage capacity.

Figure 4:
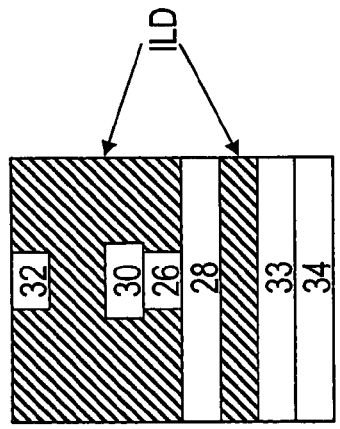
FIG. 4 shows a memory chip.

FIG. 4 depicts a memory chip 20 with the magnetic memory 14 replicated many times as indicated by 14A–I. Input-output pads 22 are also shown, and serve to couple individual memory elements to the outside of the memory chip 20. Each individual memory element within magnetic memory 14A–I may need to be coupled to an input-output pad using routing wires. As more and more magnetic memory 14 is packed onto the memory chip 20, routing for individual memory elements becomes more congested. For example, it may be difficult to route wires from magnetic memory 14E to one of the input-output pads 22 because surrounding magnetic memory may obstruct the path, making the chip 20 more difficult and costly to manufacture.

In accordance with certain embodiments, write lines of a magnetic memory may be used to convey data to various locations on the chip in addition to using the write lines to perform traditional functions of writing information to a memory element. Tri-state buffers may be coupled to the write line to aid in asserting data on the write line while it is not in use for write purposes. In this manner, data may be conveyed along write lines during time periods when the write line is not being used for write purposes. By using existing conductors, such as memory write lines, the number and complexity of conductors on the chip may be reduced. In addition, the number and complexity of decoding circuitry may also be reduced because the write line may be used to assist in decoding the desired memory element.

FIG. 5A shows a cross-section of an integrated magnetic memory element 26 capable of storing data by altering its magnetic field. Read line 28 (spanning left to right in FIG. 5A), may be electrically coupled to memory element 26. Read line 30, with direction into the page, may also be electrically coupled to memory element 26. With read lines 28 and 30 electrically coupled to memory element 26, the resistance of memory element 26 may be measured by passing a current through memory element 26. An interlayer dielectric ("ILD") electrically isolates read line 30 from write line 32, where write line 32 may run parallel to read line 30. Likewise an ILD may also isolate read line 28 from write line 33, where write line 33 may run parallel to read line 28. Therefore, write lines 32 and 33 may remain electrically isolated from memory element 26, but may be coupled to memory element 26 via magnetic fields. Circuitry 34, which may be used to control the read and write functions of memory element 26, may be integrated beneath the write line 33.

Although FIG. 5A shows read line 30 parallel to write line 32 (i.e., both with direction into the page), and read line 28 parallel to write line 33 (i.e., both spanning left to right), it should be understood this orientation is not necessary. In fact the read and write lines at each end of element 26 may be orthogonal to each other. Write lines 32 and 33 are generally orthogonal with respect to each other (as shown in FIG. 2B), in order to allow desired memory elements to be selected. FIG. 5A may be referred to as a "four-conductor" magnetic memory element because four conductors (i.e., read and write lines 28, 30, 32, and 33) are used in operating the memory element. A "three-conductor" magnetic memory element may also be fabricated by combining a read line with a write line. For example, read line 28 may be combined with write line 33 to form a single read/write line while read line 30 and write line 32 may be maintained as two separate conductors. FIG. 5B shows one possible three-conductor structure, where read line 28 and write line 32 are combined to form read/write line 35.

Figure 5C:
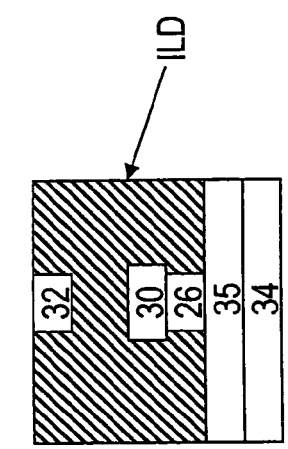
FIG. 5C shows a schematic representation of the magnetic memory element shown in FIG. 5B.
Figure 5B:
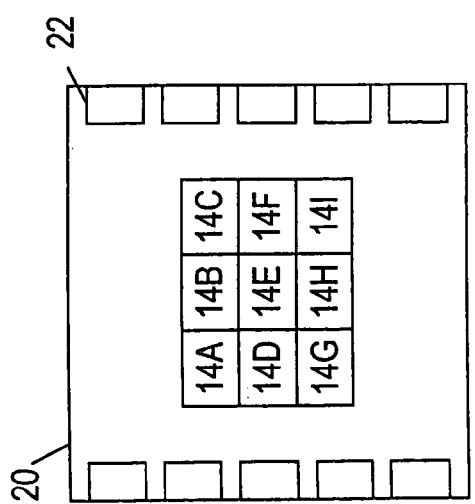
FIG. 5B shows a cross-section of a magnetic memory element having three conductors.

FIG. 5C illustrates a schematic representation of the three-conductor version of the magnetic memory element shown in FIG. 5B, where corresponding elements are numbered alike and memory element 26 is represented using a resistive element. Because write line 32 is magnetically coupled to memory element 26, write line 32 may be utilized for functions other than conveying write data, such as conveying data to various locations on the chip and/or decoding column select information.

FIG. 6 shows an exemplary circuit embodiment that may be used in conjunction with write line 32 to convey data to various locations on the chip and also to assist in decoding column select information. Write line 32 may be coupled to input-output pad 36, so that when write line 32 is not being used for writing purposes, it may be used to convey data to input-output pad 36. Tri-state buffers 38 and 40 may have their outputs coupled to write line 32 as shown, and may be used to control write line 32 using circuitry 34. In order to control the read and write functions of memory elements, circuitry 34 may be coupled to the data and enable inputs (indicated by D and E respectively) of buffer 38 and may also be coupled to the enable input of buffer 40. A latch 42 may be coupled to write line 32 and the data input of buffer 40. The latch 42 may retain data sent on write line 32, where the data may then be coupled to the data input of buffer 40 when the enable line is asserted. Buffer 40 and latch 42 may be physically close to each other on the chip, while buffer 38 may be separated from buffer 40 and latch 42 by significant physical distance.

Buffers 38 and 40 may have output states of high, low, and high-impedance for the various combinations of input states as shown in FIG. 7. With the enable input (node E) low, the output may be high-impedance (indicated by the letter Z), regardless of the state of the data input (node D). With node E high, the output follows the state of node D, i.e., when node D is high, the output is high; and when node D is low, the output is low.

Circuitry 34 may contain data that is to be transmitted to various locations on the chip. For example, circuitry 34 may contain data that represents values stored in memory elements, where this data may be intended for an input-output pad. In order to convey data from the circuitry 34 to another location along the write line 32, such as input-output pad 36, buffer 38 may be enabled (i.e., node E taken high) and the data to be conveyed on write line 32 may be asserted at the data input to buffer 38. In addition, buffer 40 may be disabled (i.e., node E taken low), when write line 32 is not being used for writing data to a memory element. With the output of buffer 40 at high-impedance, the write line is unaffected by the presence of buffer 40 and may transmit data to various points along write line 32, including input-output pad 36.

In addition to transmitting data to various locations on the chip, circuitry 34 may also facilitate writing data to memory elements. As was discussed with regard to FIGS. 2B and 5C, data may be written to memory elements by conducting currents in their write lines, where these currents induce magnetic fields in the memory elements. Also, in order to be able to induce varying magnetic fields in a memory element, current may need to flow in both directions in a write line. Referring again to FIG. 6, write line 32 may have current generated in either direction by altering the output state of buffers 38 and 40. That is, current may flow from buffer 38 to buffer 40 when the output of buffer 38 is high and the output of buffer 40 is low. Alternatively, current may also flow from buffer 40 to buffer 38 when the output of buffer 38 is low and the output of buffer 40 is high. Buffers 38 and 40 may be of varying strengths—i.e., capable of sourcing or sinking varying amounts or currents—so that the amount of current in write line 32, and consequently the amount of magnetic field emanating from write line 32, may be controlled by adjusting the strength of buffers 38 and 40. Accordingly, as the output values of buffers 38 and 40 are different, current may be generated in one direction or another so as to have a lasting effect on a memory element and cause data to be written to the memory element.

FIG. 8 shows another circuit embodiment that may be used in conjunction with write line 32 to communicate data to various locations on the chip and write data to a memory element. At least three tri-state buffers 43, 44, and 46 may be coupled to write line 32. The output of buffers 43 and 44 may be coupled to write line 32 and the data input of buffer 46 may also be coupled to write line 32. In order to write data to a receiving point along write line 32, the data input of buffer 43 may be provided with data. The enable input of buffer 43 may then be taken high and the enable input of buffer 44 may be taken low. In this manner, the output of buffer 43 may be able to drive the write line 32 while buffer 44 is high-impedance and does not affect write line 32. In addition, the enable input of buffer 46 may be taken high so that the data value may be received by buffer 46 and amplified by buffer 46 to reinforce the data value prior to arriving at the receiving point. The receiving point may be located a substantial distance away from buffer 43 and therefore the data value may need to be amplified by buffer 46.

Alternatively, in FIG. 8, buffers 43 and 44 may be used to write data to a memory element that is magnetically coupled to write line 32. In order to write data to a memory element, data may be provided to buffers 43 and 44 and the enable inputs of buffers 43 and 44 may be taken high. The outputs of buffers 43 and 44 may then be set at different values—i.e., the output of buffer 43 high and the output of buffer 44 low, and vice versa. With the outputs of buffers 43 and 44 at different values, a variable amount of current may flow in write line 32, which may cause a magnetic field to emanate from write line 32 and consequently write data to the memory element. The actual value of the amount of current in the write line may depend on several factors so that the desired value for the current, and consequently the magnetic field, may be adaptively determined.

Figure 9:
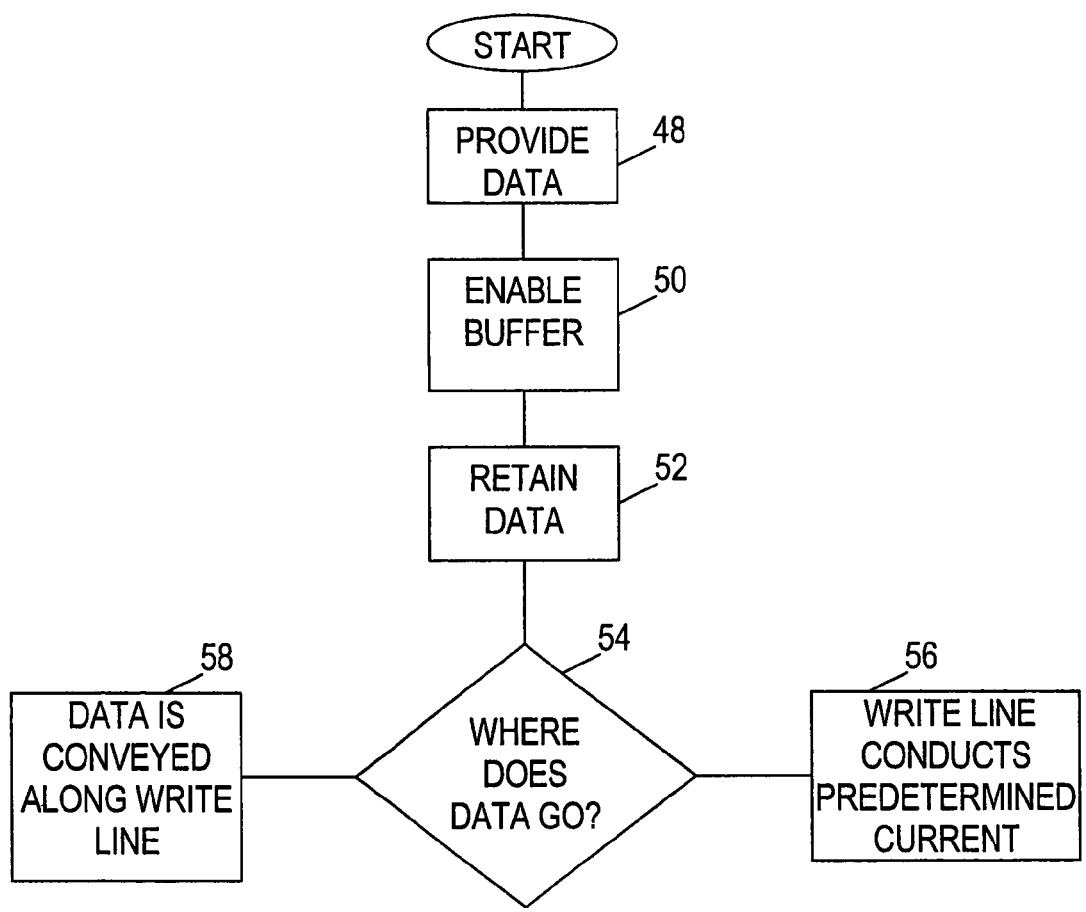
FIG. 9 shows a flowchart illustrating a write operation.

In addition to utilizing existing write lines for communicating non-write data, write data may be communicated along write lines prior to actually writing the data to the memory element. FIG. 9 shows a flowchart that illustrates a possible communication sequence for writing information to a memory element using write line 32 as shown in FIG. 6. In block 48, buffer 38 may be provided with data using circuitry 34. Block 50 involves enabling buffer 38 using circuitry 34, which may transfer the data provided to buffer 38 to write line 32. In block 52, the latch 42 may retain the data on the write line 32, and the latch 42 may then provide buffer 40 with the data. Block 54 involves deciding whether the data on write line 32 represents data to be written to a memory element or whether the data on write line 32 represents data intended for another location on along write line 32. Block 56 represents the condition when data is to be written to a memory element, where circuitry 34 may enable buffer 40 so that write line 32 may conduct a variable amount of current, where the actual amount may be adaptively determined. With the write line 32 conducting current having a specific direction, a magnetic field may be induced in memory elements that are adjacent to the write line and the data sent to latch 42 may be stored in a memory element. The variable amount of current may be set by the strength of buffers 38 and 40, so that the magnetic field emanating from line 32 may attain a desired value. The latch 42 and the buffer 40 may be part of the same circuit block at the end of write line 32. Block 58 represents the condition when the data is to be communicated to another location along write line 32, where circuitry 34 may disable buffer 40 so that its output is in a high-impedance state and therefore decoupled from write line 32.

Because the write lines may be used for both communicating data and writing information to memory elements, circuitry 34 may be used to arbitrate control of the write line.

Figure 10:
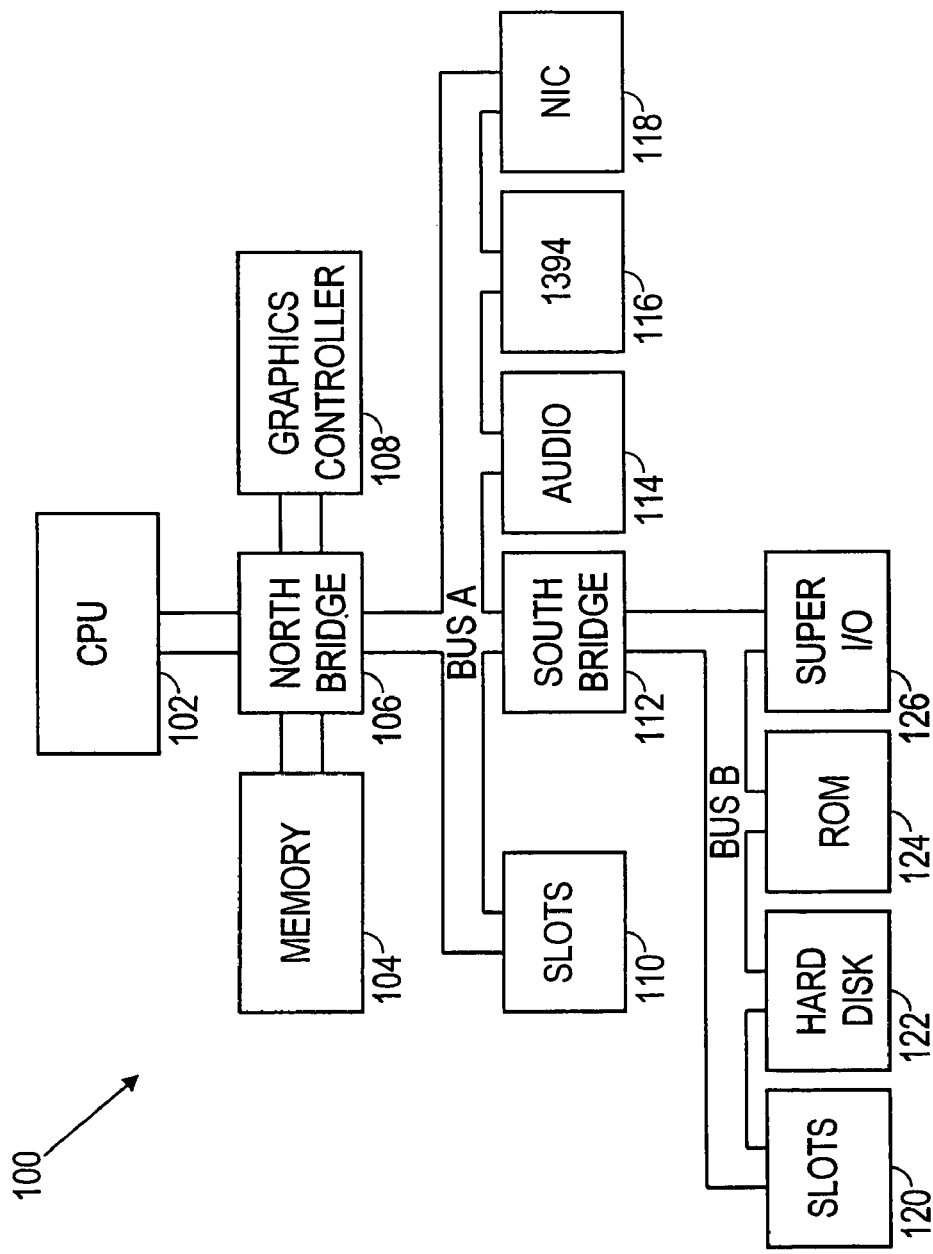
FIG. 10 shows an exemplary computer system.

The memory disclosed herein may be used in a computer system. FIG. 10 illustrates an exemplary computer system 100. The computer system of FIG. 10 includes a CPU 102 that may be coupled to a bridge logic device 106 via a CPU bus. The bridge logic device 106 is sometimes referred to as a "North bridge." The North bridge 106 couples to a main memory array 104 by a memory bus, and may further couple to a graphics controller 108 via an advanced graphics processor ("AGP") bus. The main memory array 104 may be a magnetic memory array as disclosed above. The North bridge 106 couples CPU 102, memory 104, and graphics controller 108 to the other peripheral devices in the system through, for example, a primary expansion bus ("BUS A") such as a PCI bus or an EISA bus. Various components that operate using the bus protocol of BUS A may reside on this bus, such as an audio device 114, a IEEE 1394 interface device 116, and a network interface card ("NIC") 118. These components may be integrated onto the motherboard, as suggested by FIG. 10, or they may be plugged into expansion slots 110 that are connected to BUS A.

If other secondary expansion buses are provided in the computer system, another bridge logic device 112 may be used to couple the primary expansion bus ("BUS A") to the secondary expansion bus ("BUS B"). This bridge logic 112 is sometimes referred to as a "South bridge." Various components that operate using the bus protocol of BUS B may reside on this bus, such as a hard disk controller 122, a system ROM 124, and Super I/O controller 126. Slots 120 may also be provided for plug-in components that comply with the protocol of BUS B.

Exemplary embodiments of the preferred embodiment may reduce chip area and routing complexity. For example, utilizing existing write lines while they are not being used for writing data to memory elements may reduce the number of route lines and complexity of the chip. Also, because the write line may be used to convey decode data, the amount of decode circuitry used on the chip may be reduced, which may then reduce total chip area.

Thus, various magnetic memory embodiments have been described in which at least one write line operates in at least two modes, including a write mode and a communication mode. In write mode the write line is operable to store data in a memory element. This mode may occur by having buffers coupled to the write line, where the output of the buffers have different states in order to effectuate a desired amount of current flow in the write line, which may then have a lasting effect on a magnetic memory element. In the communication mode, the write line is operable as a communication path to transfer data past the array of memory elements to a receiving point, potentially without any lasting effect on the contents of memory elements in the array. In general the amount of current in the write line during write mode and communication mode may vary significantly. For example, in write mode the current may be in the milliampere range whereas in the communication mode, the current may be in the microampere range. Because there may be several orders of magnitude difference between the write mode and the communication mode current, the currents in the write line during the write mode may have a lasting effect on the magnetic memory element, whereas the currents in the communication mode may not. Consequently, in order to keep the amount of current in the write line to an acceptable level, lower strength current drivers may be used.

The above discussion is meant to be illustrative of the principles and various embodiments of the present invention. Numerous variations and modifications will become apparent to those skilled in the art once the above disclosure is fully appreciated. For example, although the memory elements are shown as resistive elements, the memory elements may be implemented with other circuit elements such as capacitors, inductors, diodes, and transistors. Also, the principles disclosed equally apply to any number and type of conductors on a chip that are temporarily not being used. In fact, the techniques disclosed may be even more beneficial in memory elements that contain a greater number of conductors (e.g., four-conductor). It is intended that the following claims be interpreted to embrace all such variations and modifications.

What is claimed is:

1. A memory, comprising:
   a memory element;
   a control circuit;
   a write conductor that is magnetically coupled to the memory element and electrically coupled to the control circuit; and
   wherein said write conductor is capable of communicating non-write data.

2. The memory of claim 1, wherein said non-write data includes a data value stored in the memory element that is read utilizing the write conductor that is magnetically coupled to the memory element.

3. The memory of claim 1, further comprising a first buffer, a second buffer, and a latch, wherein the write conductor is electrically coupled to the control circuit using said first buffer, and wherein said second buffer and said latch are electrically coupled to the write conductor.

4. The memory of claim 3, further comprising a latch electrically coupled to the write conductor and the second buffer, wherein said latch couples data between said write conductor and said second buffer.

5. The memory of claim 4, wherein the buffers comprise tri-state buffers.

6. The memory of claim 5, wherein said first buffer is enabled by the control circuit and said second buffer is disabled by the control circuit and the write conductor conveys non-write data.

7. The memory of claim 5, wherein said first buffer is enabled by the control circuit and said second buffer is enabled by the control circuit and the write conductor conducts a variable amount of current.

8. The memory of claim 7, wherein the current in the write conductor causes a desired magnetic field in the memory element.

9. The memory of claim 8, wherein the magnetic field may be adjusted by varying the amount and direction of current in the write conductor.

10. A means for storing data in memory, comprising:
    loading means, for loading a first buffer that is electrically coupled to a write conductor with a data value;
    enabling means, for enabling the first buffer such that the data value occupies the write conductor;
    retaining means, for retaining the data value from write conductor;
    loading means, for loading a second buffer that is electrically coupled to the write conductor; and
    enabling means, for enabling the second buffer such that the write conductor conducts a variable amount of current.

11. The means for storing data of claim 10, wherein the write conductor is magnetically coupled to a memory and a current flowing in the write conductor causes a magnetic field in the memory.

12. The means for storing data of claim 10, wherein the amount and direction of current in the write conductor is capable of being adjusted using the buffers.

13. A computer system, comprising:
    a processor;
    a bridge logic device coupled to said processor;
    a system memory coupled to said processor, wherein said memory includes:
        at least one memory element;
        a control circuit;
        a write conductor that is magnetically coupled to the memory element and electrically coupled to the control circuit; and
        wherein said write conductor is capable of communicating non-write data.

14. The memory of claim 13, wherein said non-write data includes a data value stored in the memory element that is read utilizing the write conductor that is magnetically coupled to the memory element.

15. The memory of claim 13, further comprising a first buffer, a second buffer, and a latch, wherein the write conductor is electrically coupled to the control circuit using said first buffer, and wherein said second buffer and said latch are electrically coupled to the write conductor.

16. The memory of claim 15, further comprising a latch electrically coupled to the write conductor and the second buffer, wherein said latch couples data between said write conductor and said second buffer.

17. The memory of claim 15, wherein the buffers comprise tri-state buffers.

18. The memory of claim 17, wherein said first buffer is enabled by the control circuit and said second buffer is disabled by the control circuit and the write conductor conveys non-write data.

19. The memory of claim 17, wherein said first buffer is enabled by the control circuit and said second buffer is enabled by the control circuit and the write conductor conducts a variable amount of current.

20. A memory circuit, comprising:
    a first buffer loaded with non-write data and electrically coupled to a write conductor;
    a second buffer electrically coupled to the write conductor;
    wherein the write conductor is magnetically coupled to at least one magnetic memory element;
    wherein the second buffer is disabled and the first buffer is enabled, thereby allowing the non-write data in the first buffer to be conveyed to other areas of the memory circuit.

21. The memory circuit of claim 20, further comprising a latch circuit coupled to the second buffer, wherein the latch circuit retains write data conveyed on the write conductor.

22. The memory circuit of claim 21, wherein the write data in the latch circuit is conveyed to the second buffer when the second buffer is enabled.

23. The memory circuit of claim 20, wherein electrical current is capable of flowing in either direction in the write conductor thereby altering a digital state of the memory element.

24. The memory circuit of claim 20, further comprising a control circuit capable of arbitrating control of the write conductor between write and non-write states.

* * * * *